United States Patent [19]
Mori

[11] Patent Number: 5,903,181
[45] Date of Patent: May 11, 1999

[54] VOLTAGE-CONTROLLED TRANSISTOR DRIVE CIRCUIT

[75] Inventor: Haruyoshi Mori, Tokyo, Japan

[73] Assignee: Mitsubishi Denki Kabushiki Kaisha, Tokyo, Japan

[21] Appl. No.: 08/756,252

[22] Filed: Nov. 25, 1996

[30]     Foreign Application Priority Data

| May 28, 1996 | [JP] | Japan | ................................. 8-133775 |
| Jul. 19, 1996 | [JP] | Japan | ................................. 8-190719 |

[51] Int. Cl.⁶ ........................................................ H03K 5/08
[52] U.S. Cl. .......................... 327/389; 327/108; 327/312; 327/320; 327/321
[58] Field of Search .................... 327/108, 312, 327/320, 321, 389

[56]            References Cited

U.S. PATENT DOCUMENTS

| 4,949,213 | 8/1990 | Sasagawa et al. | ........................ 361/91 |
| 5,091,664 | 2/1992 | Furuhata | ................................. 307/570 |
| 5,097,142 | 3/1992 | Yap | ......................................... 307/254 |
| 5,287,252 | 2/1994 | Miyasaka | ................................. 307/594 |
| 5,675,268 | 10/1997 | Petty et al. | ................................ 327/77 |

FOREIGN PATENT DOCUMENTS 6395728   4/1988   Japan .

OTHER PUBLICATIONS

Licitra, Carmelo, et al. "A New Driving Circuit for IGBT Devices." *IEEE Transactions on Power Electronics* vol. 10, No. 3, May, 1995: pp. 373–378.

*IGBT Designer's Manual.* El Segundo: International Rectifier, 1994.

*Primary Examiner*—Margaret R. Wambach
*Attorney, Agent, or Firm*—Leydig, Voit & Mayer

[57]            ABSTRACT

A voltage-controlled transistor drive circuit includes a gate-voltage generating circuit for outputting on and off gate signal voltages in response to an input signal, switching a voltage-controlled transistor by applying the gate voltage to the gate of the voltage-controlled transistor; and a current limiting circuit limiting current flowing from the gate of the voltage-controlled transistor to the gate-voltage generating circuit when the gate-voltage generating circuit outputs an off gate signal voltage.

6 Claims, 8 Drawing Sheets

VOLTAGE-CONTROLLED TRANSISTOR DRIVE CIRCUIT

BACKGROUND OF THE INVENTION

1. Field of the Invention

The present invention relates to a drive circuit for voltage-controlled transistors, and more particularly to an improved drive circuit that reduces the voltage surge applied to an inverter circuit during the occurrence of overcurrent.

2. Description of Related Art

A great number of power switching circuits using voltage-controlled transistors have been proposed. There are various kinds of voltage-controlled transistors. For example, there are insulated gate bipolar transistors (hereinafter referred to as IGBTs) which have an insulated gate and operate in the bipolar mode, insulated gate field-effect transistors which have an insulated gate and operate in the field-effect mode, and metal-oxide-semiconductor field-effect transistors.

A chopper circuit using a general gate drive circuit is shown in FIG. 9 and this gate drive circuit is described in IGBT DESIGNER'S MANUAL (E-17, 1994), published by International Rectifier.

In FIG. 9, a diode 2 and a load device 3, connected in parallel, are connected to a dc voltage source 1 in series. The collector (C) of an IGBT 5 is connected to the parallel circuit comprising of the diode 2 and the load device 3. An inductor 4 exists between the IGBT 5 and the parallel circuit. The IGBT 5 has an emitter (E) which is connected to the negative side of the dc voltage source 1 and a gate (G) which is connected to a drive circuit 6 described below. If a positive voltage is applied between the gate (G) and the emitter (E), current will flow between the collector (C) and the emitter (E). Alternatively, if the voltage between the gate (G) and the emitter (E) becomes less than a threshold voltage, current won't flow between the collector (C) and the emitter (E).

IGBT includes $C_{GC}$ 51, the collector-to-gate capacitance, and $C_{GE}$ 52, the gate-to-emitter capacitance of the. A drive circuit 6 turns the IGBT 5 on and off. The drive circuit 6 is equipped with a dc voltage source 61 for driving the drive circuit 6, a switch 62 which is turned on to apply a positive voltage to the gate of the IGBT 5 when turning on the IGBT 5, a switch 63 which is turned on to make the gate of the IGBT 5 a voltage of zero volts when turning off the IGBT 5, and a resistor (gate resistor) 64a which determines the charging-discharging constant of the gate of the IGBT 5. A signal generating circuit 7 for generating "on" and "off" commands is connected to the switches 62 and 63 of the IGBT 5. The behavior and operation of the aforementioned conventional circuit of the present invention will next be described.

If the switch 63 is turned off and the switch 62 is turned on by the the signal generating circuit 7, a positive voltage is applied to the gate of the IGBT 5 through the resistor 64a, so the IGBT 5 is turned on and a current flows from the dc voltage source 1 through the load 3. Next, if the switch 62 is turned off and the switch 63 is turned on, the gate voltage of the IGBT 5 becomes less than a threshold voltage, so the IGBT 5 is turned off and the current flowing through the load 3 returns through the diode 2.

Suppose that the load 3 is shorted when the IGBT 5 is on, various waveforms of the chopping circuit in FIG. 9 are shown in FIG. 10. In FIG. 10, the voltage on the connection point between the switches 62 and 62 is represented by $V_s$, the gate-to-emitter voltage of the IGBT 5 by $V_{GE}$, and the collector-to-emitter voltage of the IGBT 5 by $V_{CE}$, and the collector current of the IGBT 5 by $I_C$.

Assuming that at time T0 the load 3 is shorted, the collector current $I_C$ will abruptly rise, the IGBT 5 reaches the operation of the active region, and $V_{CE}$ rises. As $V_{CE}$ rises, a current expressed by the following equation flows from the collector of the IGBT 5 into the gate of the IGBT 5 and the gate voltage rises (time T1 to time T2).

$$C_{GC} \times dV_{CE}/dt$$

In general, a resistor $R_g$ is inserted into the gate of the IGBT for smoothly switching the IGBT on and off. Suppose the voltage of the drive-circuit voltage source 61 is Vg1. When an "on" command is given from the signal generating circuit to the IGBT 5, the gate voltage $V_{GE}$ of the IGBT 5 rises to a value shown by the following equation, and because of the device characteristic of the IGBT 5, an even larger current flows.

$$V_{GE}=Vg1+C_{GC} \times dV_{CE}/dt \times R_g$$

Overcurrent, although not shown, is usually detected and the IGBT 5 is turned off so that it is not destroyed by overcurrent. Because the current of the IGBT 5 changes at the turn-off time, the following voltage is applied between the collector and the emitter of the IGBT 5 (time T2 to time T3).

$$V_{CE}=V_{DC}+L \times di/dt$$

This voltage is the surge voltage (which is expressed by the product of the inductance L of the inductor 4 and the rate of change of the collector current $I_C$ of the IGBT 5) superimposed on the magnitude $V_{DC}$ of the dc voltage source 1. The rate of change of the collector current at this time is determined by the device characteristic of the IGBT 5 and is approximately proportional to the rate of change of the gate voltage of the IGBT 5. Therefore, if the rate of change of the gate voltage becomes large, the rate of change of the collector current will also become large. If an "off" command is given to the IGBT 5 when the gate voltage of the IGBT 5 is rising, the rate of change of the gate voltage is large and thus the rate of change of the collector current also becomes large. As a result, the collector-to-emitter voltage becomes large and, in the worst case, the IGBT 5 is sometimes damaged.

Another prior art publication will next be described.

A diode 65 is provided in Japanese Patent Laid-Open No. 63-95728 for suppressing a rise in the gate voltage of the IGBT, as shown in FIG. 11. Others are the same as the aforementioned prior art shown in FIG. 10 and so a description will not be given.

The behavior and operation of the prior art shown in FIG. 11 will hereinafter be described.

Assuming that at time T0 the load 3 is shorted, the collector current $I_C$ will abruptly rise, the IGBT reaches the operation of the active region, and the collector current $V_{CE}$ rises (time T1 to time T2). As the collector current rises, a current expressed by the following equation flows from the collector of the IGBT through the collector-to-gate capacitance $C_{GC}$ into the gate of the IGBT, and the gate voltage rises.

$$C_{GC} \times dV_{CE}/dt$$

In general, a resistor $R_g$ is inserted into the gate of the IGBT for smoothly switching the IGBT on and off. Assume the voltage of the voltage source of the gate circuit is Vg1. When an "off" command signal is output from the signal generating circuit 7 to the IGBT 5, the gate voltage $V_{GE}$ of the IGBT tries to reach a value indicated by the following equation, but the rise in the gate voltage is limited to the value of the following equation due to the operation of the diode 65 (time T2 to time T3).

$$V_{GE}=Vg1+C_{GC} \times dV_{CE}/dt \times R_g$$

If between time T2 and time T3 the rise in the gate voltage is suppressed due to the operation of the diode 65, the diode is turned on by the time the collector current $I_C$ begins to fall, after the operation delay time $\Delta T$ of the IGBT 5. Therefore, as if the IGBT is turned on when the resistance of the gate resistor is zero, the collector current decreases abruptly at a rate of $dI_C/dt$, and the voltage represented by the following equation occurs until the collector current reaches its stable state. As a result, in the worst case the IGBT is sometimes damaged.

$$V_{CE}=V_{DC}+L \times dI_C/dt$$

Thereafter, an overcurrent detecting circuit, although not shown, usually detects overcurrent, and the IGBT 5 is operated so that it is turned off (after T4).

The conventional drive circuits for a voltage-controlled transistor such as an IGBT, as described above, have the problem that a large voltage surge occurs and in the worst case an IGBT is sometimes damaged, when a large current due to circuit failure flows and the IGBT operates in the active region, or when current is cut off during the operation in the active region.

SUMMARY OF THE INVENTION

The present invention solves the aforementioned problems. It is the objective of the present invention to provide a voltage-controlled transistor drive circuit which is capable of suppressing and cutting off voltage surge even when overcurrent occurs.

A voltage-controlled transistor drive circuit of the present invention comprises a gate-voltage generating circuit which outputs a gate voltage in accordance with an input signal controlling the on or off state of said voltage-controlled transistor and applies said gate voltage to the gate of said voltage-controlled transistor, and a current limiting circuit which limits current flowing from said gate to said gate-voltage generating circuit within a prescribed value when said gate-voltage generating circuit outputs an off signal voltage.

In the voltage-controlled transistor drive circuit, said current limiting circuit is constructed such that it operates when said gate-voltage generating circuit outputs said off signal voltage and that said current from said gate to said gate-voltage generating circuit is limited within a prescribed value.

With such arrangement, the current from the gate to the gate-voltage generating circuit is limited at the turn-off time of the voltage-controlled transistor. Therefore, the change rate in the collector current can be suppressed at the turn-off time of the voltage-controlled transistor and surge voltage can be reduced.

According to the present invention, in the voltage-controlled transistor drive circuit, said current limiting circuit comprises a gate-voltage detecting circuit for detecting the gate voltage of said voltage-controlled transistor and a resistance-value changing circuit for changing a resistance value of a resistor through which said current is driven to flow by a detection signal of said gate-voltage detecting circuit.

With such arrangement, a rise in the gate voltage is detected with the gate-voltage detecting circuit and the gate resistor is increased. Therefore, the change rate in the collector current can be suppressed at the turn-off time of the voltage-controlled transistor and surge voltage can be reduced.

In the voltage-controlled transistor drive circuit, said current limiting circuit is constituted by a constant-current circuit.

With such arrangement, the constant-current circuit limits current so that the current does not become larger than a current value detected by the current detecting circuit. Therefore, the change rate in the collector current can be suppressed at the turn-off time of the voltage-controlled transistor and surge voltage can be reduced.

In the voltage-controlled transistor drive circuit, said current limiting circuit comprises at least one gate resistor inserted between said gate-voltage generating circuit and said gate and a series circuit provided between the gate of said transistor gate and said gate-voltage generating circuit. The series circuit consists of a diode having a forward direction from said gate to said gate-voltage generating direction and a resistor.

With such arrangement, when the gate voltage becomes higher than the voltage of the voltage source used for turning on the voltage-controlled transistor, the gate charge is discharged through a resistor. Therefore, the collector current is prevented from becoming excessive and thus surge voltage can be suppressed.

According to the present invention, in the voltage-controlled transistor drive circuit, said current limiting circuit further comprises at least one gate resistor inserted between said gate-voltage generating circuit and said gate.

With such arrangement, discharge current is limited within a prescribed value in correspondence with a rise in the gate voltage by the gate-voltage detecting circuit. Therefore, the collector current is prevented from becoming excessive and thus surge voltage can be suppressed.

According to the present invention, in the voltage-controlled transistor drive circuit, said current limiting circuit comprises a gate-voltage detecting circuit for detecting said gate voltage and a resistance-value changing circuit for changing a resistance value. The resistance-value changing circuit is driven by said gate-voltage detecting circuit.

With such arrangement, the value of a discharge resistance becomes large in correspondence with a rise in the gate voltage by the gate-voltage detecting circuit. Therefore, the collector current is prevented from becoming excessive and thus surge voltage can be suppressed.

According to the present invention, in the voltage-controlled transistor drive circuit, said current limiting circuit comprises a differential-voltage detecting circuit for detecting a differential voltage between said gate voltage and said gate-voltage generating circuit and a resistance-value changing circuit for changing a resistance value. The resistance-value changing circuit is driven by said differential-voltage detecting circuit.

With such arrangement, the differential-voltage detecting circuit, which detects a differential voltage between said gate voltage and the voltage source used for turning on IGBT 5, adjusts the value of the discharge resistance and precisely controls the change rate in the gate voltage at the time of discharging. Therefore, the collector current is prevented from becoming excessive and thus surge voltage can be suppressed.

According to the present invention, in the voltage-controlled transistor drive circuit, said current limiting circuit is constituted by a constant-current circuit.

With such arrangement, the constant-current circuit operates so as to suppress the change rate in the gate voltage. Therefore, the collector current is prevented from becoming excessive and thus surge voltage can be suppressed.

According to the present invention, in the voltage-controlled transistor drive circuit, said current limiting circuit comprises means for opening, at the turn-off time of said voltage-controlled transistor, a series circuit which discharges discharge current in a direction from said gate to said gate-voltage generating circuit.

With such arrangement, the discharge resistance value at the turn-off time is increased by the path opening means. As a consequence, the collector current is prevented from becoming excessive and thus surge voltage can be suppressed.

According to the present invention, in the voltage-controlled transistor drive circuit, said current limiting circuit comprises, between said gate and said gate-voltage generating circuit, a series circuit comprising of a circuit, which limits discharge current flowing in a direction from said gate to said gate-voltage generating circuit within a prescribed value, and a diode.

With such arrangement, the current limiting circuit can suppress a rise in the gate voltage and can also suppress the change rate in the gate voltage at the turn-off time, so that surge voltage can be suppressed.

The above and other objects and advantages of the present invention will become apparent from the following detailed description when read in conjunction with the drawings.

DETAILED DESCRIPTION OF THE PREFERRED EMBODIMENTS

First Embodiment

Figure 1:
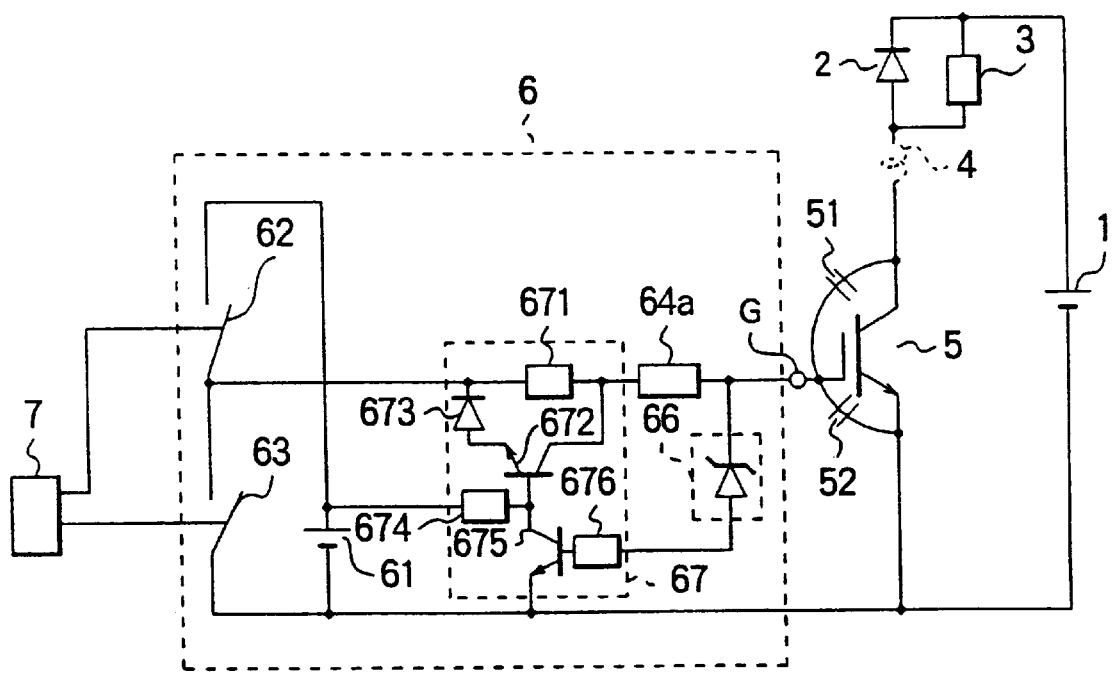
FIG. 1 is a circuit diagram of a voltage-controlled transistor drive circuit showing a first embodiment of the present invention.
Figure 9:
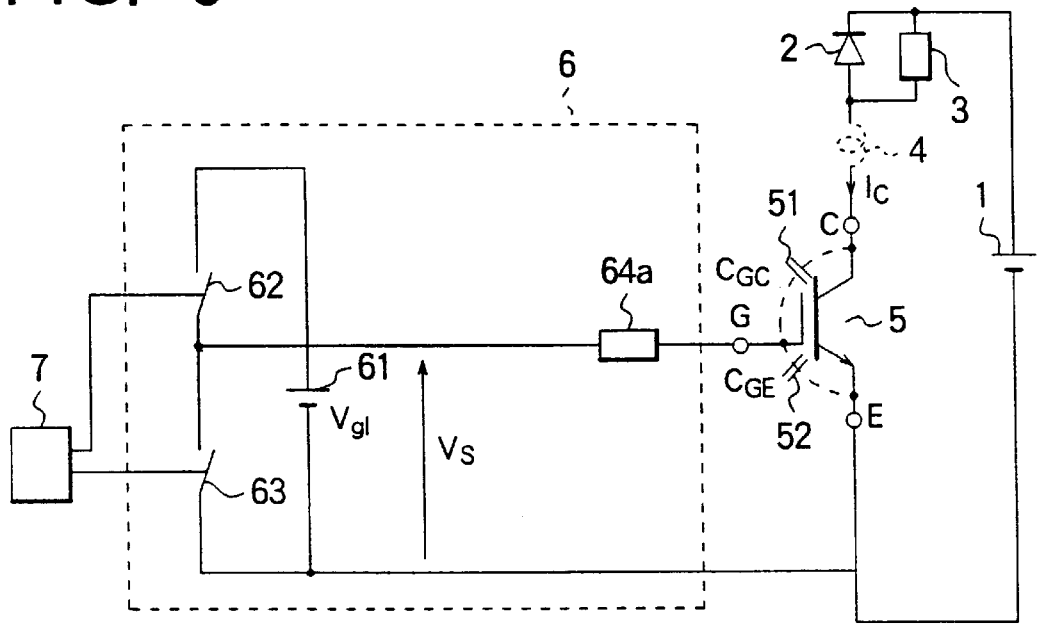
FIG. 9 is circuit diagram showing a general conventional voltage-controlled transistor drive circuit.
Figure 10:
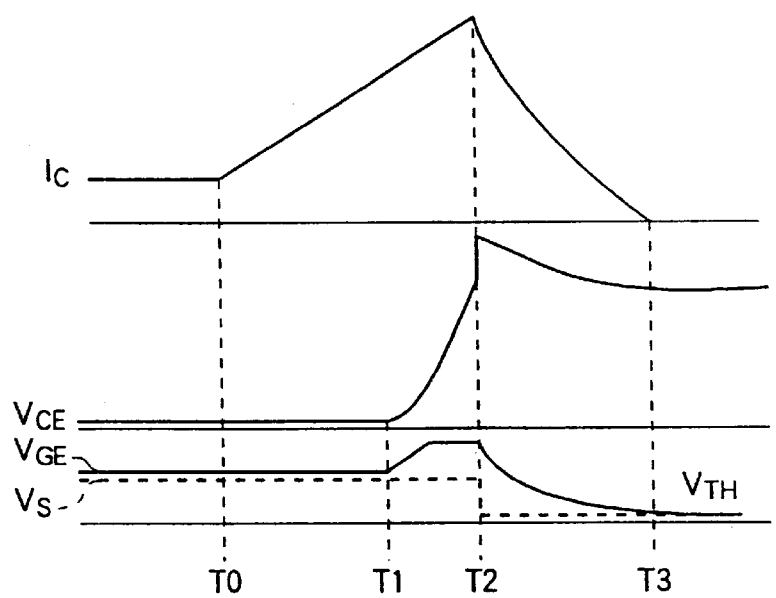
FIG. 10 is a waveform diagram showing the operation of the conventional voltage-controlled transistor drive circuit.

The first embodiment of the present invention will hereinafter be described based on the drawings. In FIG. 1, reference numerals 1 through 5, 51, 52, 61 through 64a, and 7 represent the same elements as in FIG. 9 and so additional description of them here is omitted.

In the first embodiment, one end of a gate-voltage detecting circuit 66 is connected between one end of a resistor 64a and the gate electrode of an IGBT 5, and a gate-resistance-value switching circuit 67 is connected to the other end of the resistor 64a and the other end of the gate-voltage resistor 64a.

The gate-resistance-value switching circuit 67 is constituted by a resistor 671 connected to the other end of the resistor 64a for limiting the discharge current from the gate electrode of the IGBT 5, a transistor 672 having its collector connected to one end of the first resistor 671 and its emitter connected to the other end of the first resistor 671 through a reverse-voltage prevention diode 673 and turning the resistor 671 on and off to change the resistance value, a base-current supply resistor 674 connected between the base of the transistor 672 and a drive-circuit voltage source 61 for turning on the transistor 672, a transistor 675 having its collector connected to the base of the transistor 672 and its emitter connected to the negative sides of a voltage source 1 and the drive-circuit voltage source 61 and turning the transistor 672 on and off, and a base-current limiting resistor 676 connected between the base of the transistor 675 and a gate-voltage detecting circuit 66 for limiting the base current of the transistor 675 to limit the base current of the transistor 672. The gate-voltage detecting circuit 66 is a Zener diode, which consists of a cathode connected to the gate electrode of the IGBT 5 and an anode connected to the base-current limiting resistor 676. The drive-circuit voltage source 61 and the switches 62 and 63 constitute a gate-voltage generating circuit of this invention.

In the constructed drive circuit for the insulated gate transistors which are voltage-controlled transistors, when an overcurrent causes the transistor to operate in the active region and the raised gate voltage is turned off, the gate-voltage detecting circuit 66 detects that the gate voltage has risen, and turns on the transistor 675. If the transistor 675 is turned on, the transistor 672 is turned off and, in addition to the resistor 64a, the resistor 671 is connected in series in the discharge path at the turn-off time. Therefore, the change in the rate of the gate voltage is suppressed and the rate of change of current at turn-off is suppressed. As a consequence, surge voltage is suppressed.

Second Embodiment

Figure 2:
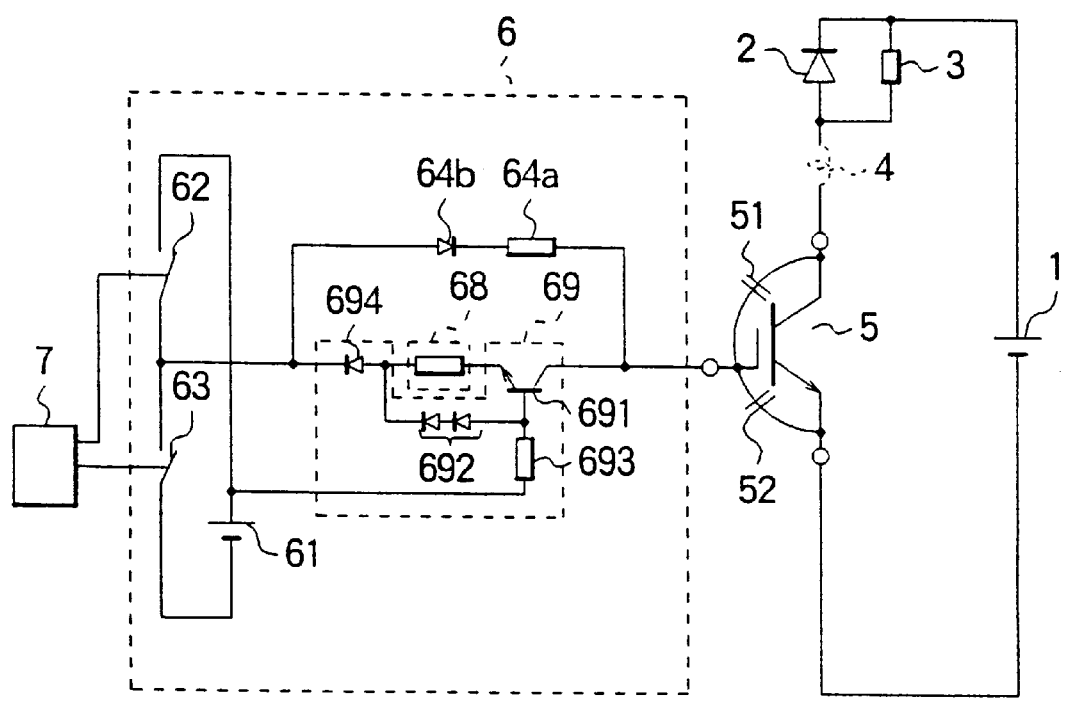
FIG. 2 is a circuit diagram of a voltage-controlled transistor drive circuit showing a second embodiment of the present invention.

The second embodiment of the present invention will hereinafter be described based on the drawings. In FIG. 2, reference numerals 1 through 5, 51, 52, 61 through 63, and 7 represent the same elements as in FIG. 9 and so additional description of them here is omitted. In the second embodiment a series circuit, comprising of a resistor 64a and a diode 64b, are connected between the switches 62 and 63 and the gate electrode of an IGBT 5. Also, a discharge-current detecting resistor 68 and a discharge-current limiting circuit 69 are connected between the switches 62 and 63 and the gate electrode of the IGBT 5, and the discharge-current limiting circuit 69 is connected to the positive side of the voltage source 61.

The resistor 64a and the diode 64b operate when turned on. The discharge-current detecting resistor 68 detects the discharge current at the off time. The discharge-current limiting circuit 69 limits discharge current, based on the current detected with the discharge-current detecting resistor 68. The general constant-current circuit comprises the discharge-current detecting resistor 68 and the discharge-current limiting circuit 69.

The discharge-current limiting circuit 69 includes a transistor 691 having its collector connected to the gate electrode of the IGBT 5, its emitter connected to one end of the resistor 68, and its base connected to a resistor 693 as described later, a diode 692 connected to the base of the transistor 691 and the other end of the resistor 68, a base-current supply resistor 693 connected between the base of the transistor 691 and the voltage source 61 for driving the transistor 691, and a reverse-voltage prevention diode 694 connected between the other end of the resistor 68 and the switches 62 and 63 for preventing the reverse voltage of the transistor 691.

In the insulated gate transistor drive circuit constructed as described above, when an overcurrent causes the device to operate in the active region and the raised gate voltage is turned off, discharge current is limited due to the operation of the raised constant-current circuit even when the gate voltage has risen. Therefore, the change rate in the gate voltage is suppressed and so the change rate of current at the turn-off time is suppressed. As a consequence, surge voltage is suppressed. By limiting current in this way, the gradient of the gate voltage at the discharge time can be limited without taking account of a rise in the gate voltage, so that the rate of change of current at off can be controlled simply in comparison with the case where the resistance value of a resistor is changed.

Third Embodiment

Figure 3:
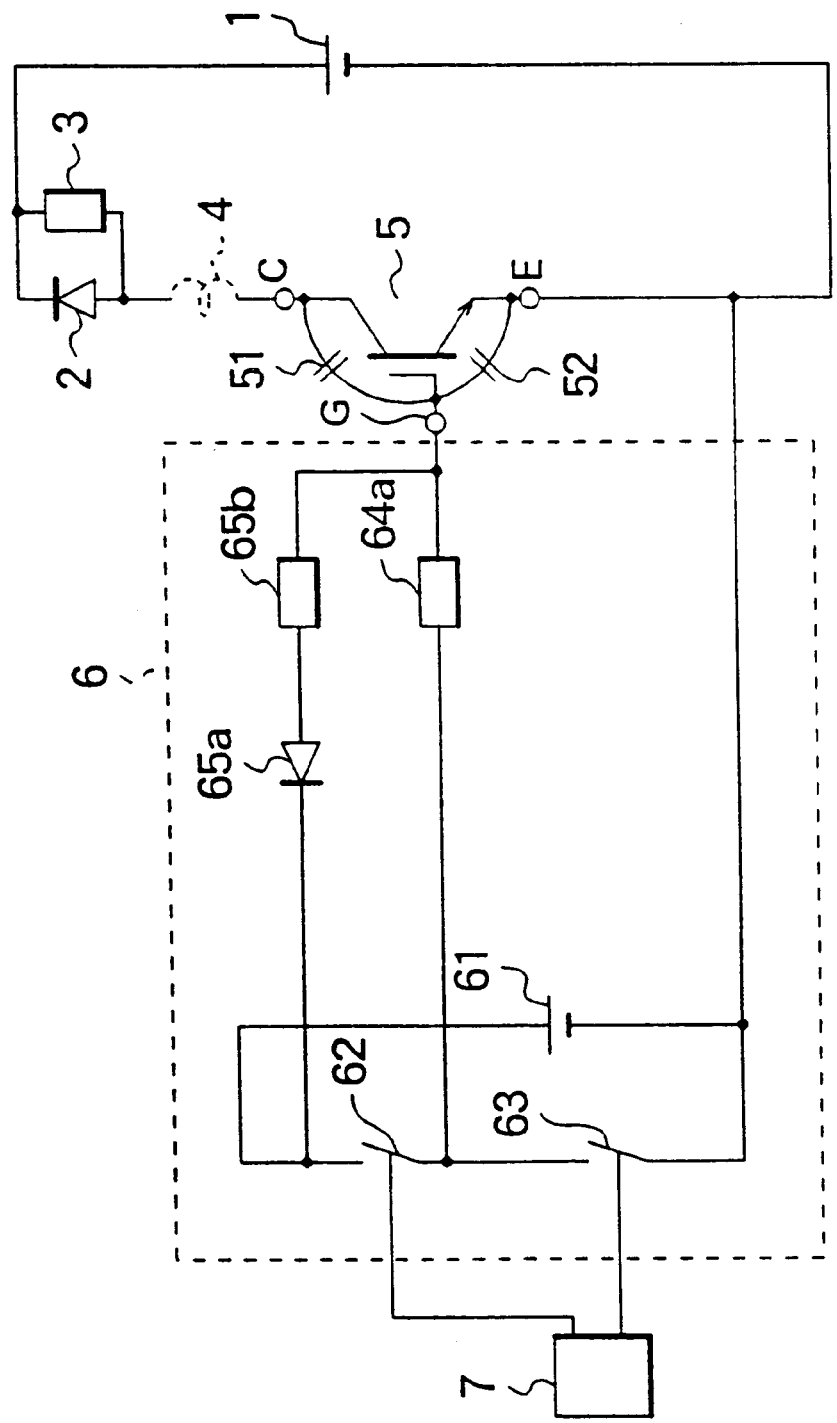
FIG. 3 is a circuit diagram of a voltage-controlled transistor drive circuit showing a third embodiment of the present invention.
Figure 11:
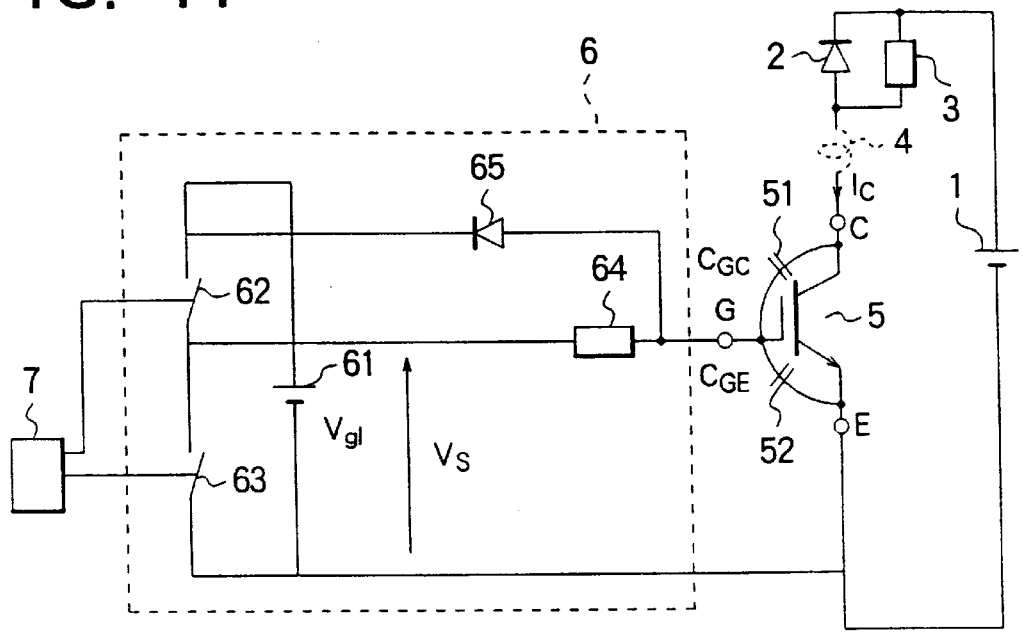
FIG. 11 is circuit diagram showing another conventional voltage-controlled transistor drive circuit.
Figure 12:
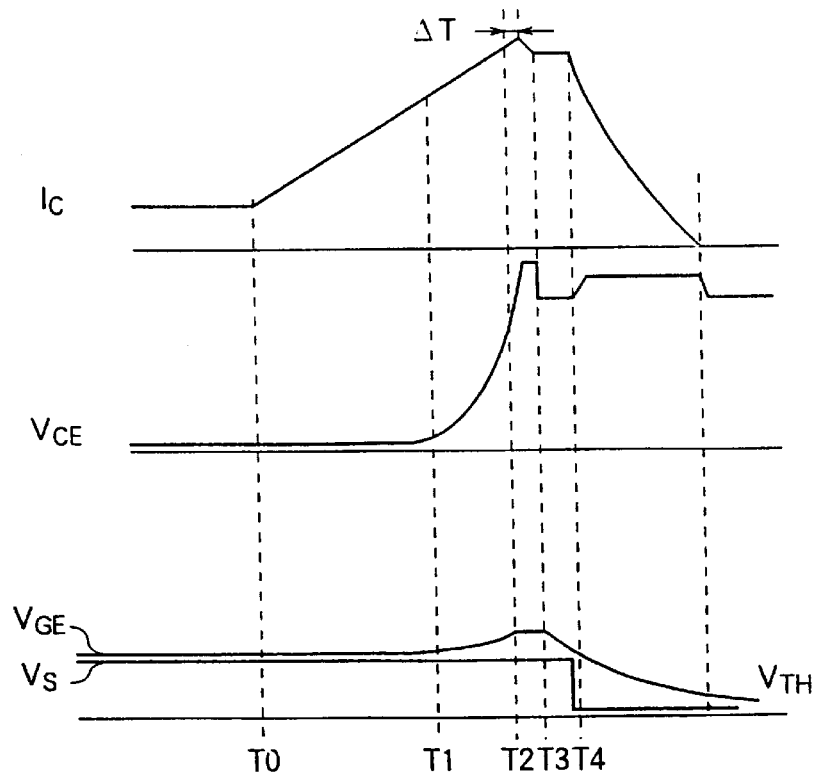
FIG. 12 is a waveform diagram showing the operation of still another conventional voltage-controlled transistor drive circuit.

The third embodiment of the present invention will next be described based on FIG. 3. In the figure, reference numerals 1 through 5, 51, 52, 61 through 64, and 7 represent the same elements as in FIG. 11 and so additional description here of them is omitted. A resistor 65b is connected between the gate voltage of an IGBT 5 and a diode 65a and provided in a discharge path from the gate electrode to a drive-circuit voltage source (voltage source for turning on the IGBT 5) 61.

In the insulated gate transistor drive circuit constructed as described above, when an overcurrent causes the device to operate in the active region and the gate voltage rises, electric charge is slowly discharged from the gate electrode to the drive-circuit voltage source 61, so that no abrupt change in the gate voltage occurs. For this reason, a change in the collector current also becomes slow and therefore surge voltage is suppressed.

Fourth Embodiment

The fourth embodiment of the present invention will next be described based on FIG. 4. In the figure, reference numerals 1 through 5, 51, 52, 61 through 64, 65a, and 7 represent the same elements as in FIG. 11 and so additional description here of them is omitted.

Figure 4:
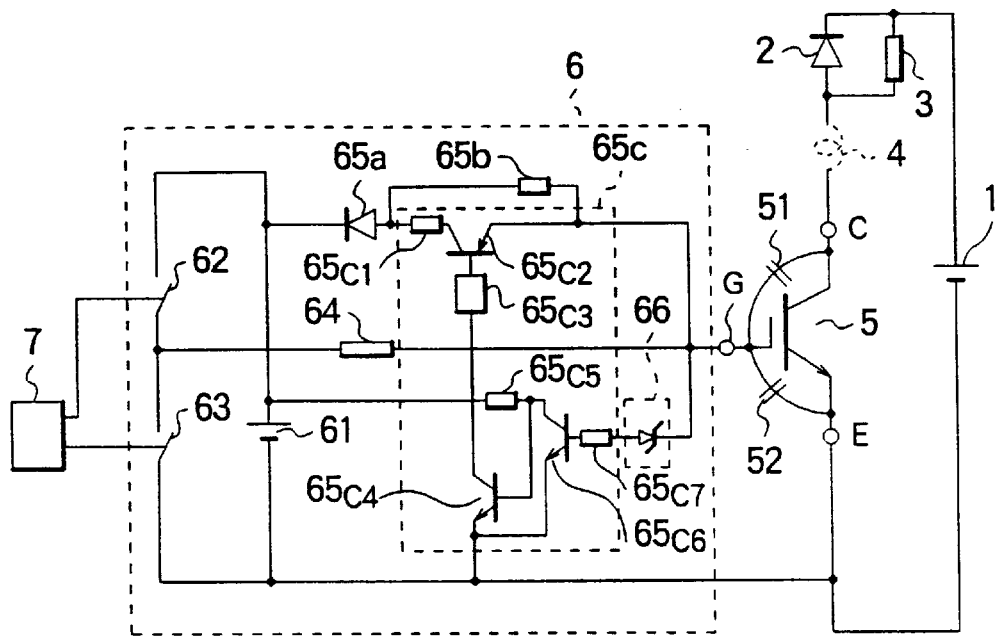
FIG. 4 is a circuit diagram of a voltage-controlled transistor drive circuit showing a fourth embodiment of the present invention.

In FIG. 4, a resistor 65b is provided in a discharge path from the gate electrode of an IGBT 5 to a drive-circuit voltage source 61, a resistor switching circuit 65c connected in parallel to the resistor 65b for switching a discharge resistance from the gate electrode of the IGBT 5 to the drive-circuit voltage source 61, and 66 a gate-voltage detecting circuit.

The resistor switching circuit 65c includes a resistor 65c1 connected in parallel to the resistor 65b, a switch transistor 65c2 having its collector connected to the resistor 65c1 for switching the resistor 65c1 on and off, a resistor 65c3 having one end connected to the base of the transistor 65c2 for determining the base current, a transistor 65c4 connected to the other end of the resistor 65c3 for switching the transistor 65c2 on and off, a transistor 65c6 having its emitter connected to the emitter of the transistor 65c4, a resistor 65c5 connected between the base of the transistor 65c4, the collector of the transistor 65c6, and the drive-circuit voltage source 61 for determining the base currents of the transistors 65c4 and 65c6, and a resistor 65c7 connected between the base of the transistor 65c6 and the gate-voltage detecting circuit 66.

The transistor 65c2 is on when a positive voltage, which is an "on" command, has been supplied to the gate electrode of the IGBT 5. If an overcurrent flows to the collector of the IGBT 5, the IGBT 5 will operate in the active region, and if the gate voltage rises, then a current will flow to the drive-circuit voltage source 61 through the parallel circuit comprising the resistors 65b and 65c1. If a current flows to the gate-voltage detecting circuit 66 when the gate voltage further rises, the transistor 65c2 will be turned off. Therefore the resistance in the discharge path becomes large and the rate of change of in the gate of the IGBT 5 is suppressed.

In the insulated gate transistor drive circuit constructed as described above, when an overcurrent causes the device to operate in the active region and the gate voltage rises, electric charge is slowly discharged from the gate electrode to the drive-circuit voltage source 61. Even when the gate voltage further rises, the rate of change of in the gate voltage can be suppressed by increasing the resistance of the discharge path. Consequently, no abrupt change in the gate voltage occurs. For this reason, a change in the collector current also becomes slow and therefore surge voltage is further suppressed.

Fifth Embodiment

The fifth embodiment of the present invention will next be described based on FIG. 5. In the figure, reference numerals 1 through 5, 51, 52, 61 through 64, 65a, and 7 represent the same elements as in FIG. 11 and so additional description here of them is omitted.

Figure 5:
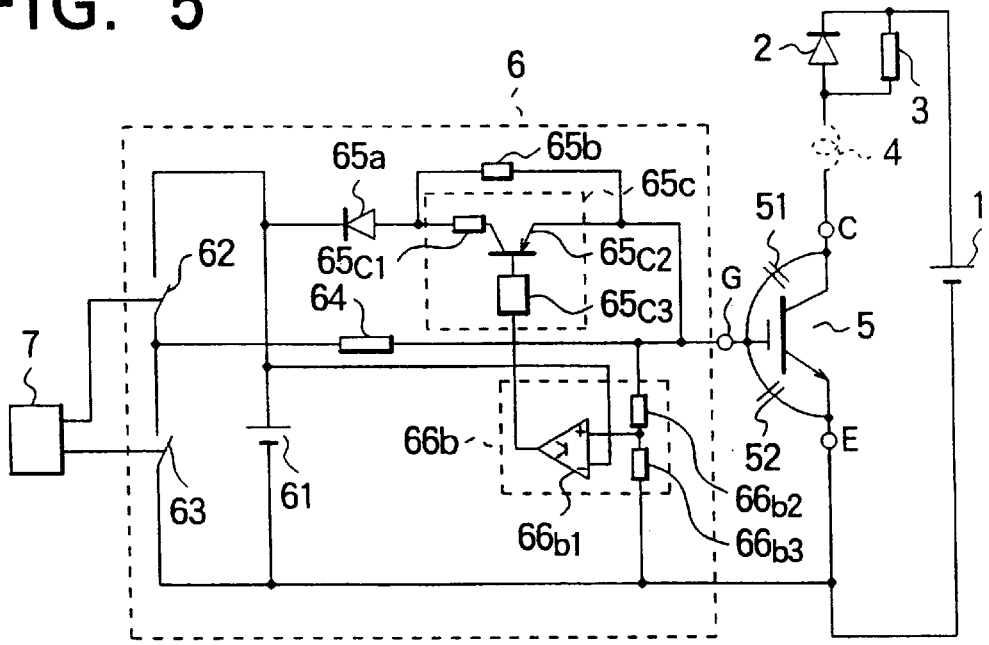
FIG. 5 is a circuit diagram of a voltage-controlled transistor drive circuit showing a fifth embodiment of the present invention.

In FIG. 5, a resistor 65b is a resistor provided in a discharge path from the gate electrode of an IGBT 5 to a drive-circuit voltage source 61, a resistor switching circuit 65c is connected in parallel with the resistor 65b for switching a discharge resistance from the gate electrode of the IGBT 5 to the drive-circuit voltage source 61, a differential-voltage detecting circuit 66b is provided between the gate electrode (of the IGBT) and the drive-circuit source 61, for detecting a differential voltage between the gate voltage of the IGBT 5 and the drive-circuit voltage source 61.

The resistor switching circuit 65c includes a resistor 65c1 connected in parallel with the resistor 65b, a switch transistor 65c2 having its collector connected to the resistor 65c1 and its emitter connected to the gate electrode of the IGBT 5 for switching the resistor 65c1 on and off, and a resistor 65c3 having one end connected to the base of the transistor 65c2 for determining the base current.

The differential-voltage detecting circuit 66b includes two resistors 66b2 and 66b3 for dividing the gate voltage of the IGBT 5, and a comparator 66b1. The non-inverting input of the comparator 66b1 is connected between the resistors 66b2 and 66b3 and its inverting input is connected to the drive-circuit voltage source 61, and the output of the comparator 66*b*1 is connected to the resistor 65*c*3. The output of the comparator 66*b*1 is constituted by an open collector, which compares the divided value of the gate voltage divided by the resistors 66*b*2 and 66*b*3 with the voltage of the drive-circuit voltage source 61.

In the aforementioned embodiment, usually the divided value of the gate voltage is less than the voltage of the drive-circuit voltage source 61 and the output of the comparator 66*b*1 is at a low level. Therefore, the transistor 65*c*2 is on when a positive voltage, which is an "on" command, has been supplied to the gate electrode of the IGBT 5.

If an overcurrent flows to the collector of the IGBT 5, the IGBT 5 will then operate in the active region, and if the gate voltage rises, then a current will flow to the drive-circuit voltage source 61 through the parallel circuit comprising of the resistors 65*b* and 65*c*1. If the output of the comparator 66*b*1 goes high when the gate voltage further rises, the transistor 65*c*2 will be turned off. Therefore, the resistance in the discharge path becomes large and the change rate in the gate of the IGBT 5 is suppressed.

In the insulated gate transistor drive circuit constructed as described above, when an overcurrent causes the device to operate in the active region and the gate voltage rises, electric charge is slowly discharged from the gate electrode to the drive-circuit voltage source 61. Even when the gate voltage further rises, the rate of change of the gate voltage can be suppressed by increasing the resistance of the discharge path. Consequently, no abrupt change in the gate voltage occurs. Furthermore, even when the voltage of the drive-source voltage source 61 varies, the resistance of the discharge circuit can be changed dependably, because the differential voltage between the gate voltage of the IGBT 5 and the voltage of the drive-circuit voltage source 61 is detected.

Sixth Embodiment

Figure 6:
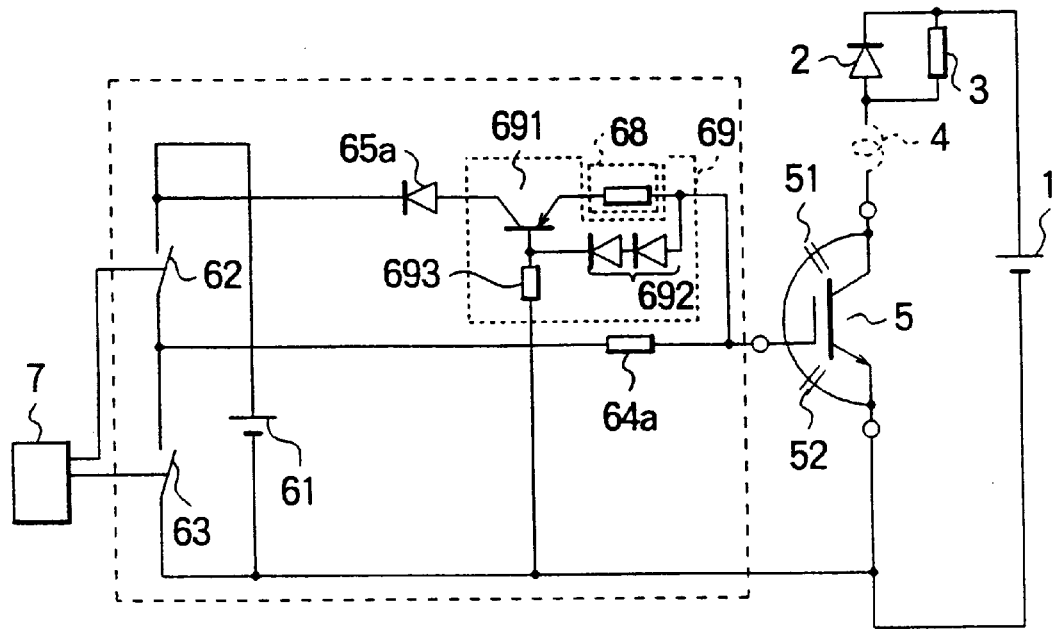
FIG. 6 is a circuit diagram of a voltage-controlled transistor drive circuit showing a sixth embodiment of the present invention.

The sixth embodiment of the present invention will next be described based on FIG. 6. In the figure, reference numerals 1 through 5, 51, 52, 61 through 63, and 7 represent the same elements as in FIG. 11 and so additional description here of them is omitted. A gate resistor 64*a* is connected between the gate electrode of an IGBT 5 and switches 62 and 63. Also, a discharge-current detecting resistor 68 and a discharge-current limiting circuit 69 are connected between the gate electrode of the IGBT 5 and a drive-circuit voltage source 61. The discharge-current detecting resistor 68 detects current which is discharged from the gate electrode to the drive-circuit voltage source 61, and the discharge-current limiting circuit 69 limits discharge current, based on the current detected with the discharge-current detecting resistor 68. The discharge-current detecting resistor 68 and the discharge-current limiting circuit 69 constitute a general constant-current circuit.

The discharge-current limiting circuit 69 includes a transistor 691 having its emitter connected to the other end of the resistor 68 connected to the gate electrode of the IGBT 5 and its collector connected to the anode of the diode 65*a*, a diode 692 connected between the gate electrode of the IGBT 5 (one end of the resistor 68) and the base of the transistor 691, and a base-current supply resistor 693 connected to the base of transistor 691, for driving the transistor 691. The diode 65*a* is a reverse-voltage prevention diode 694 for preventing the reverse voltage of the transistor 691.

In the thus constructed drive circuit for insulated gate transistors which are voltage-controlled transistors, when an overcurrent causes the device to operate in the active region and the gate voltage rises, a current flows from the gate electrode to the drive-circuit voltage source 61, but it is limited by the constant-current circuit. Therefore, a change in the gate voltage arises slowly. Furthermore, even when the voltage of the drive-source voltage source 61 varies, this circuit can be operated reliably.

Seventh Embodiment

Figure 7:
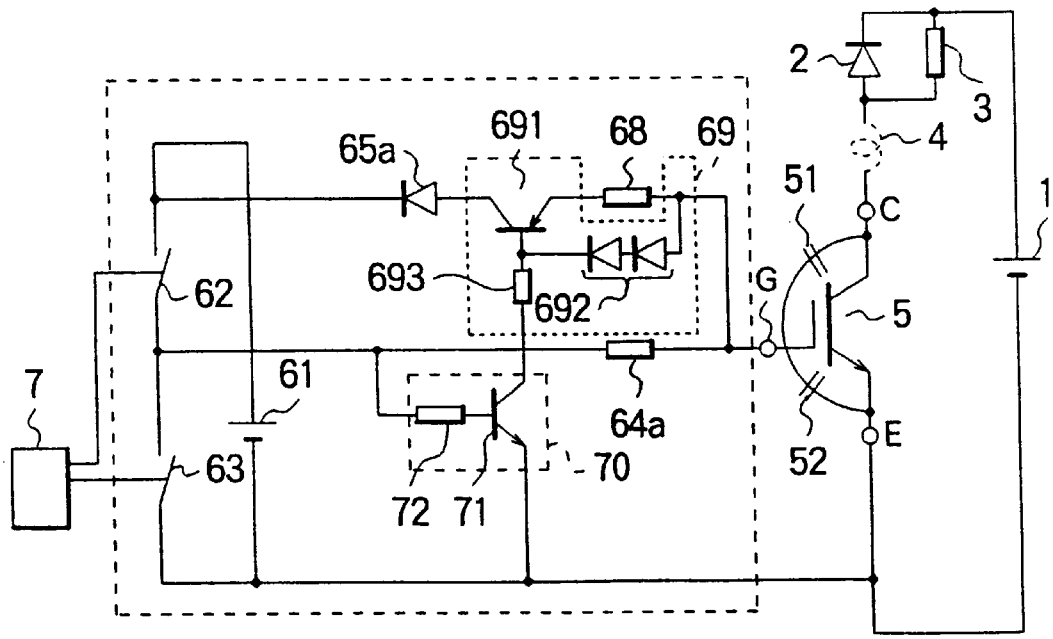
FIG. 7 is a circuit diagram of a voltage-controlled transistor drive circuit showing a seventh embodiment of the present invention.

The seventh embodiment of the present invention will next be described based on FIG. 7. In the figure, reference numerals 1 through 5, 51, 52, 61 through 63, and 7 represent the same elements as in FIG. 11 and so additional description here of them is omitted. Also, the circuit construction of a discharge prevention diode 65*a*, a discharge-current detecting resistor 68 for detecting current which is discharged from a gate electrode to a drive circuit voltage source 61, and a discharge-current limiting circuit 69 are the same as shown in FIG. 6.

In the seventh embodiment a gate-voltage detecting circuit 70 is connected to the other end of a resistor 693, which in turn is connected to the base of a transistor 691. The gate-voltage detecting circuit 70 is used to prevent the discharging of the current from the gate electrode to the drive-circuit voltage source 61 when an "off" voltage is output. This gate-voltage detecting circuit 70 is constituted by a transistor 71 having its collector connected to the resistor 693 and its emitter connected to both the emitter electrode of the IGBT 5 and the negative side of the drive-circuit voltage source 61 and a resistor 72 connected between the base of the resistor 71 and switches 62 and 63.

According to the gate-voltage detecting circuit 70, a base current does not flow to the transistor 71 through the resistor 72 when an "off" signal (low level) is output. Therefore, the transistor 71 is turned off and so the transistor 691 is turned off.

In the aforementioned construction the transistor 71 is on when an "on" command has been output. Therefore, if an overcurrent flows through the collector of the IGBT 5, the IGBT 5 will then operate in the active region, and if the gate voltage becomes higher than the voltage of the drive-circuit voltage source 61, the gate charge will then be discharged from the gate electrode to the drive-circuit voltage source 61 so that the current detected through the current limiting circuit 69 by the discharge-current detecting resistor 68 becomes less than a prescribed value. On the other hand, while not shown, in the case where an overcurrent is detected, for example, with the overcurrent detecting circuit of the transistor and an "off" signal is output, a current has been discharged from the gate of the transistor to the drive-circuit voltage circuit by that time, when the gate voltage has risen, however, at the same time the off signal is output, the discharging of the current to the drive-circuit voltage source is shifted to discharging through the resistor 64*a* and the switch 63. With this, even in the case where an off signal is output when the gate voltage is rising, the gate voltage varies smoothly without increasing discharge current. Therefore, no abrupt change in the collector current occurs and a transistor can be cut off without an occurrence of overvoltage.

Eighth Embodiment

Figure 8:
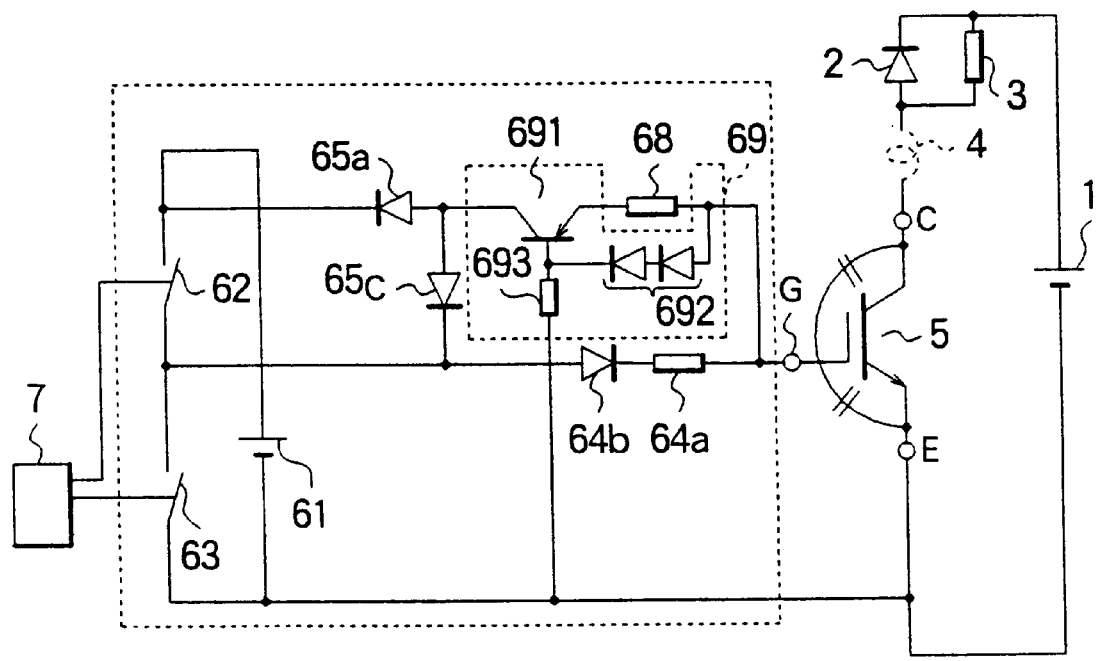
FIG. 8 is a circuit diagram of a voltage-controlled transistor drive circuit showing an eighth embodiment of the present invention.

The eighth embodiment of the present invention will next be described based on FIG. 8. In the figure, reference numerals 1 through 5, 51, 52, 61 through 63, and 7 represent the same elements as in FIG. 11 and so additional description here of them is omitted. Also, the circuit construction of a discharge prevention diode 65a, a discharge-current detecting resistor 68 for detecting current which is discharged from a gate electrode to a drive circuit voltage source 61, and a discharge-current limiting circuit 69 is the same as shown in FIG. 6.

In the eighth embodiment, between a resistor 64a connected at one end thereof to a gate electrode of an IGBT 5 and switches 62 and 63, a diode 64b is connected with its cathode connected to the resistor 64a. Also, between the collector of a switch transistor 691 and the switches 62 and 63, a diode 65c is connected with its cathode faced between the switches 62 and 63.

The diode 64b is used so that the resistor 64a operates when turned on. The diode 65c is a reverse-voltage prevention diode for preventing the reverse voltage of the transistor 691. Even in this embodiment, a resistor 68 and a discharge-current limiting circuit 69 constitute a general constant-current circuit.

In the aforementioned circuit construction when an "on" command has been output, if an overcurrent flows through the collector of the IGBT 5, the IGBT 5 will then operate in the active region, and if the gate voltage becomes higher than the voltage of the drive-circuit voltage source 61, the gate charge will then be discharged from the gate electrode to the drive-circuit voltage source 61 so that the current detected through the current limiting circuit 69 by the discharge-current detecting resistor 68 becomes less than a prescribed value. On the other hand, while not shown, in the case where an overcurrent is detected, for example, with the overcurrent detecting circuit of the IGBT 5 and an "off" signal is output, a current has been discharged from the gate of the transistor to the drive-circuit voltage circuit by that time. When the gate voltage has risen, however, at the same time the off signal is output, the discharging of the current to the drive-circuit voltage source is shifted to discharging through the diode 65c and the switch 63. With this, even in a case where an off signal is output when the gate voltage is rising, the gate voltage varies smoothly without increasing discharge current. Therefore, no abrupt change in the collector current occurs and the IGBT 5 can be cut off without an overvoltage. In addition, because the current limiting circuit 69 is used for both the discharging performed when the gate voltage rises at the turn-on time of the IGBT 5 and the discharging at the turn-off time, the circuit becomes simple and so the circuit can be made cheaply and with high reliability.

While the invention has been described with reference to preferred embodiments thereof, it is to be understood that modifications or variations may be easily made without departing from the scope of this invention which is defined by the appended claims.

What is claimed is:

1. A voltage-controlled transistor drive circuit comprising:

a gate-voltage generating circuit for outputting on and off gate signal voltages in accordance with an input signal for switching a voltage-controlled transistor and applying the gate signal voltage to a gate of the voltage-controlled transistor; and a current limiting circuit limiting a current flowing from the gate to said gate-voltage generating circuit when said gate-voltage generating circuit outputs an off gate signal voltage wherein said current limiting circuit comprises at least one gate resistor connected in series between said gate-voltage generating circuit and the gate of the voltage-controlled transistor, a gate-voltage detecting circuit for detecting gate voltage of the voltage-controlled transistor, and a resistance-changing circuit for changing a resistance of a resistor through which the current flows in response to a gate voltage detected by said gate-voltage detecting circuit.

2. A voltage-controlled transistor drive circuit comprising:

a gate-voltage generating circuit for outputting on and off gate signal voltages in accordance with an input signal for switching a voltage-controlled transistor and applying the gate signal voltage to a gate of the voltage-controlled transistor; and a current limiting circuit limiting a current flowing from the gate to said gate-voltage generating circuit when said gate-voltage generating circuit outputs an off gate signal voltage wherein said current limiting circuit comprises at least one gate resistor electrically connected between said gate-voltage generating circuit and the gate of the voltage-controlled transistor, and a series circuit electrically connected between and to the gate of the voltage-controlled transistor and to said gate-voltage generating circuit, the series circuit comprising a resistor and a diode having a forward direction from the gate of the voltage-controlled transistor to said gate-voltage generating circuit.

3. A voltage-controlled transistor drive circuit comprising:

a gate-voltage generating circuit for outputting on and off gate signal voltages in accordance with an input signal for switching a voltage-controlled transistor and applying the gate signal voltage to a gate of the voltage-controlled transistor; and a current limiting circuit limiting a current flowing from the gate to said gate-voltage generating circuit when said gate-voltage generating circuit outputs an off gate signal voltage wherein said current limiting circuit comprises at least one gate resistor connected in series between said gate-voltage generating circuit and the gate of the voltage-controlled transistor, a gate-voltage detecting circuit for detecting gate voltage of the voltage-controlled transistor, and a resistance-changing circuit for changing a resistance, the resistance-changing circuit being driven by said gate-voltage detecting circuit.

4. A voltage-controlled transistor drive circuit comprising:

a gate-voltage generating circuit for outputting on and off gate signal voltages in accordance with an input signal for switching a voltage-controlled transistor and applying the gate signal voltage to a gate of the voltage-controlled transistor; and a current limiting circuit limiting a current flowing from the gate to said gate-voltage generating circuit when said gate-voltage generating circuit outputs an off gate signal voltage wherein said current limiting circuit comprises at least one gate resistor electrically connected between said gate-voltage generating circuit and the gate of the voltage-controlled transistor, said gate-voltage generating circuit includes a drive circuit voltage source, and said current limiting circuit comprises a differential-voltage detecting circuit for detecting a difference voltage between the gate signal voltage and a voltage produced by said drive circuit voltage source and a resistance-changing circuit for changing a resistance, said resistance-changing circuit being driven by said differential-voltage detecting circuit.

5. A voltage-controlled transistor drive circuit comprising:

a gate-voltage generating circuit for outputting on and off gate signal voltages in accordance with an input signal for switching a voltage-controlled transistor and applying the gate signal voltage to a gate of the voltage-controlled transistor; and a current limiting circuit limiting a current flowing from the gate to said gate-voltage generating circuit when said gate-voltage generating circuit outputs an off gate signal voltage wherein said current limiting circuit comprises at least one gate resistor connected in series between said gate-voltage generating circuit and the gate of the voltage-controlled transistor, and means for opening, upon turn-off of the voltage-controlled transistor, a series circuit for discharging a discharge current in a direction from the gate of the voltage-controlled transistor to said gate-voltage generating circuit.

6. A voltage-controlled transistor drive circuit comprising:

a gate-voltage generating circuit for outputting on and off gate signal voltages in accordance with an input signal for switching a voltage-controlled transistor and applying the gate signal voltage to a gate of the voltage-controlled transistor; and a current limiting circuit limiting a current flowing from the gate to said gate-voltage generating circuit when said gate-voltage generating circuit outputs an off gate signal voltage wherein said current limiting circuit comprises at least one gate resistor connected in series between said gate-voltage generating circuit and the gate of the voltage-controlled transistor, and electrically connected between the gate of the voltage-controlled transistor and said gate-voltage generating circuit, a series circuit comprising a diode and a circuit that limits discharge current flowing in a direction from the gate of the voltage-controlled transistor to said gate-voltage generating circuit.

* * * * *